United States Patent
Yamada et al.

(10) Patent No.: US 6,255,225 B1
(45) Date of Patent: Jul. 3, 2001

(54) METHOD OF FORMING A RESIST PATTERN, A METHOD OF MANUFACTURING SEMICONDUCTOR DEVICE BY THE SAME METHOD, AND A DEVICE AND A HOT PLATE FOR FORMING A RESIST PATTERN

(75) Inventors: Yoshiaki Yamada; Eiichi Ishikawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/359,734

(22) Filed: Jul. 23, 1999

(30) Foreign Application Priority Data

Feb. 9, 1999 (JP) .................................................. 11-031160

(51) Int. Cl.⁷ .................................................. H01L 21/302
(52) U.S. Cl. .......................... 438/725; 438/622; 438/694; 430/5; 216/49
(58) Field of Search .................................. 430/5; 438/725, 438/694, 745, 622; 216/49, 58, 95

(56) References Cited

U.S. PATENT DOCUMENTS 4,936,951 * 6/1990 Hashimoto et al. .................. 156/643
5,324,550 * 6/1994 Yamaguchi et al. ................. 427/510

FOREIGN PATENT DOCUMENTS

| 6-069124 | * | 3/1994 | (JP) . |
| 6-102673 | * | 4/1994 | (JP) . |
| 8-316121 | | 11/1996 | (JP) . |
| 9-167733 | * | 6/1997 | (JP) . |
| 10-55072 | | 1/1998 | (JP) . |
| 10-116761 | * | 5/1998 | (JP) . |
| 10-186672 | | 7/1998 | (JP) . |
| 11-174684 | * | 7/1999 | (JP) . |
| 11-186134 | * | 7/1999 | (JP) . |

* cited by examiner

Primary Examiner—Gregory Mills
Assistant Examiner—George Goudreau
(74) Attorney, Agent, or Firm—McDermott, Will & Emery

(57) ABSTRACT

A method of forming a resist pattern and a method of manufacturing a semiconductor device using the method of forming the resist pattern, characterized in that a surface of an organic base coating 3 formed on an etched film 2 is reformed depending on properties of a material of a resist film 4, whereby, in dual processes for forming a lower layer of the organic coating provided to process the etched film, an amount of usable resist is increased and an accuracy of dimensions of the etched film after processing can be improved.

2 Claims, 3 Drawing Sheets

METHOD OF FORMING A RESIST PATTERN, A METHOD OF MANUFACTURING SEMICONDUCTOR DEVICE BY THE SAME METHOD, AND A DEVICE AND A HOT PLATE FOR FORMING A RESIST PATTERN

BACKGROUND OF THE INVENTION

1. Field of the Invention

The present invention relates to a method of forming a resist pattern on a semiconductor base, the pattern having predetermined dimensions and a profile, a method of manufacturing a semiconductor device using this method of forming a resist pattern, a device and a hot plate for forming a resist pattern.

2. Discussion of Background

In manufacturing a semiconductor device, a pattern is formed by patterning a resist on an oxide film, being an etched film, such as a polysilicon film, and a metallic film, and by etching using this resist as a mask. However, in accordance with recent microminiaturization of this pattern, a resist pattern is formed by providing an anti-reflective coating for obtaining a high accuracy in controlling dimensions and maintaining a resist profile on the etched film.

As such an anti-reflective coating, an inorganic anti-reflective coating, for example, a silicon nitride ($Si_3N_4$) film, a silicon oxynitride (SiON) film, and a titanium nitride (TiN) film and an organic anti-reflective coating of a coating type are used. However, the anti-reflective coating having an inorganic base is required to be careful so as not to be harmful to a device function in a case that it is left in a semiconductor device as a final product. Also, it is difficult to establish a stable removing process in a case that such an anti-reflection film is removed. As described, it is difficult to use the anti-reflective coating having the inorganic base, and the anti-reflective coating having the organic base is advantageous because of its easy removal after photolithographing.

However, the above-mentioned conventional method of forming the resist pattern and so on had problems that pattern defects were caused, a shape of resist pattern was deteriorated, and dimensions of resist were instabilized because a surface condition of the organic base is differed by characteristics of its material, a density of the film, and so on, and therefore a resist film on an upper layer of the organic base was influenced by the surface conditions when the resist pattern was formed on the organic layer.

Such phenomenons were conspicuous when a chemically amplified resist, sensitive to an atmosphere of resist film, was used, whereby a big problem was caused when the resist, currently being a main stream of a resist for microminiaturization, was used.

In case of a positive resist, the chemically amplified resist is mainly composed of a resin obtained by bonding molecules (dissolution inhibition function group) for restricting a solubility to a portion inherently depressing a high solubility in a developing solution and a photo acid generator, wherein the resist is not dissolved in the developing solution in an unexposed portions because a reaction caused by an exposure does not proceed, and acids are generated from the acid generator by a photoreaction in an exposed portion, whereby these acids facilitate a thermal deprotection reaction of dissolution inhibition function group in the resin and finally a reaction of the resin solubilized in the developing solution.

There were problems that, in a case that materials exhibiting acid were contained in an under layer film, an deprotection reaction was abnormally proceeded because acidic materials promoted a deprotection reaction of the dissolution inhibition function group in the resist. On the other hand, there were problems that, in a case that basic materials were contained in the under layer film, acids generated during resist process were nutrized by these basic materials so as not to contribute the deprotection of the dissolution inhibition function group, and so on.

SUMMARY OF THE INVENTION

It is an object of the present invention to solve the above-mentioned problems inherent in the conventional technique and to provide a method of forming a resist pattern for improving an accuracy in dimensions of an etched film and a method of manufacturing a semiconductor device using the method of forming-the resist pattern along with an increment of a resist usable for the process of the etched film positioned on a semiconductor base.

Another object of the present invention is to provide a device for forming a resist pattern for attaining the above-mentioned object and a hot plate for preventing the device for forming the resist pattern from being contaminated by materials escaped from an organic film at a time of heat treatment of the organic film.

According to a first aspect of the present invention, there is provided a method of forming a resist pattern comprising steps of: forming an etched film on a semiconductor base; forming an organic film on the etched film; and forming a resist film on the organic film, wherein a surface of the organic film is reformed in response to properties of the resist material.

According to a second aspect of the present invention, there is provided a method of forming the resist pattern, wherein the surface of the organic film is reformed using an acidic solution.

According to a third aspect of the present invention, there is provided a method of forming the resist pattern, wherein the surface of the organic film is reformed using a base solution.

According to a forth aspect of the present invention, there is provided a method of forming the resist pattern, wherein the surface of the organic film is reformed by a surface oxidation treatment.

According to a fifth aspect of the present invention, there is provided a method of forming the resist pattern, wherein the surface of the organic film is reformed by adjusting a temperature of thermal treatment for the organic film.

According to a sixth aspect of the present invention, there is provided a method of forming the resist pattern, wherein substances to be escaped from an inside of the organic film to an outside thereof at a time of heat treatment are contained in the organic film by introducing into or bonding to the organic film.

According to a seventh aspect of the present invention, there is provided a method of manufacturing a semiconductor device utilizing one of the methods of forming the resist pattern according to the first through seventh aspects of the present invention.

According to an eighth aspect of the present invention, there is provided a method of forming a resist pattern, wherein chemical solution supplying system for reforming a surface of an organic film is installed in a resist coater cup.

According to a ninth aspect of the present invention, there is provided a hot plate having a component for trapping substances escaped from the organic film at a time of heat treatment.

BRIEF DESCRIPTION OF THE DRAWINGS

A more complete appreciation of the invention and many of the attendant advantages there of will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIG. 1a through 4 as follows, wherein the same numerical references are used for the same was similar portions and description of these portions is omitted.

EMBODIMENT 1

Embodiment 1 of the present invention will be described in reference of FIG. 1a through 3.

FIG. 1a through 1e are cross sectional views for illustrating first through fifth steps of a method of forming a resist pattern according to Embodiment 1 of the present invention. In Embodiment 1, a case that an organic anti-reflective coating is used as an organic base coating will be described. However, such an organic base coating is not limited to an anti-reflective coating.

Figure 1A:
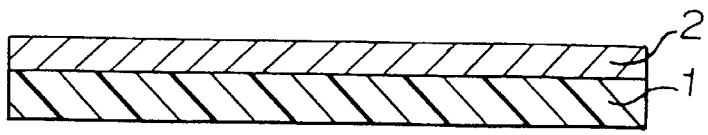
FIG. 1a is a cross sectional view for illustrating a first step of a method of forming a resist pattern according to Embodiment 1 of the present invention.
Figure 1B:
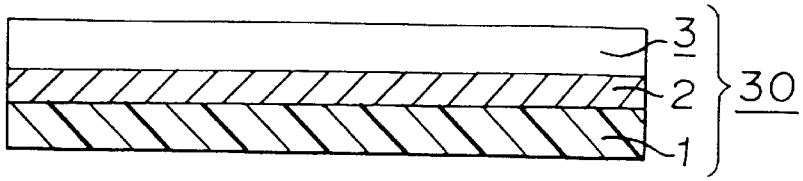
FIG. 1b is a cross sectional view for illustrating a second step of the method of forming-the resist pattern according to Embodiment 1 of the present invention.

As illustrated in FIG. 1a, an etched film in made of an oxide film, a polysilicon film, a silicide film, a metallic film, or the like is formed on a semiconductor base 1. In the next, as illustrated in FIG. 1b, an organic anti-reflective coating 3 is coated on the etched film 2. Although a material of the organic anti-reflective coating is not specifically limited, treatments in succeeding processes are changed in accordance with its characteristics and congeniality with a resist in an upper layers thereof. Heretofore, an example that an organic anti-reflective coating KrF-2, manufactured by Clariant (Japan) K.K., is exemplified. After coating, the organic anti-reflective coating is baked for sixty seconds at a temperature of 160° C. on a hot plate to form the organic anti-reflective coating 3.

Then, a base to be processed, formed with the organic anti-reflective coating 3, is treated by a conventionally used resist coater. At first, for removing moisture or the like absorbed on the organic anti-reflective coating, the base to be processed 30 is baked for sixty seconds at a temperature of 150° C. Thereafter, the base to be processed is cooled for sixty seconds at a temperature of 23° C. on a cooling plate.

Figure 2:
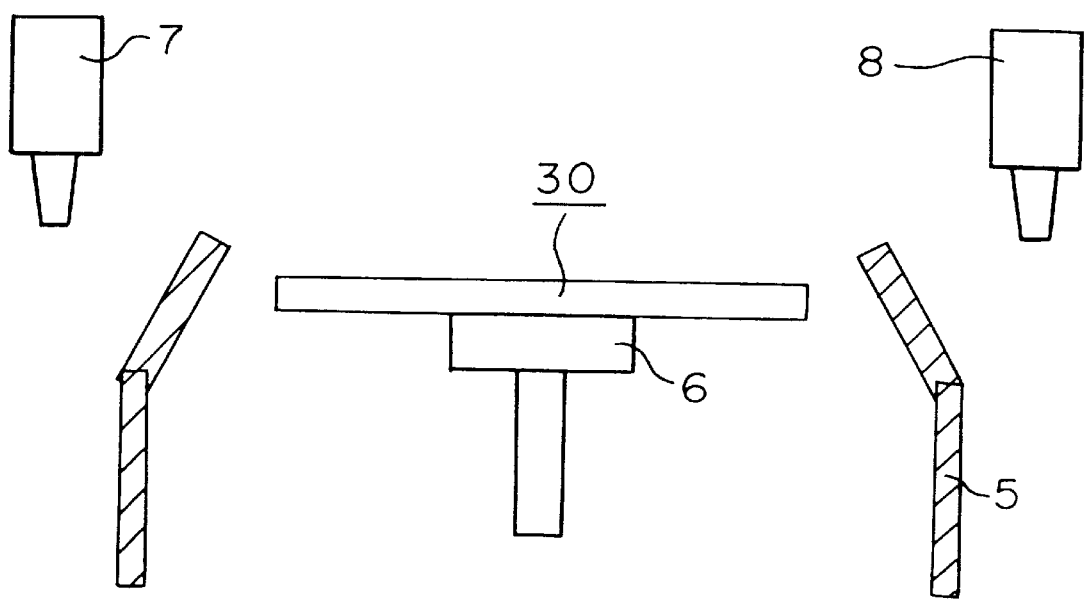
FIG. 2 schematically shows a structure of main portions of a device for forming a resist pattern according to Embodiment 1 of the present invention.

In the next, the base to be processed 30 is delivered to resist coater cup. FIG. 2 shows a structure of main portions of a device for forming the resist pattern, which conducts a surface treatment of the organic anti-reflective coating 3 and further coats the resist. In FIG. 2, the delivered substrate to be processed 30 is mounted on a chuck 6 positioned in the cup in the resist coater 5 and held by a suction force of a vacuum from a back side of the base to be processed 30. Thereafter, a nozzle for treating acid 7, which supplies an acid treating liquid and being mounted in an outside of the cut in the resist coater, is moved to a center of the base to be processed and discharges an acid from a tip of the nozzle. Such an acid is preferably an acetic acid, an oxalic acid, or the like. Hereinbelow, a case that an acetic acid is used will be described.

Figure 1C:
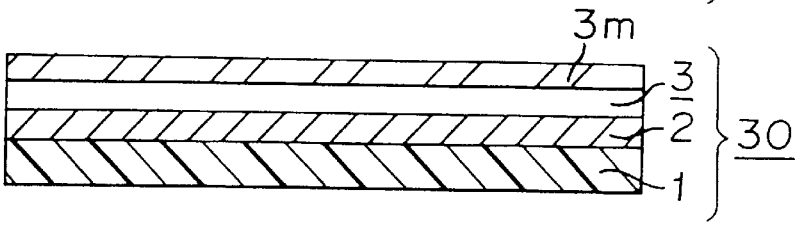
FIG. 1c is a cross sectional view for illustrating a third step of the method of forming the resist pattern according to Embodiment 1 of the present invention.

An aqueous solution of acetic acid is dropped from the nozzle for treating acid 7. At this time, the base to be processed 30 is rotated at 2,000 rpm. Therefore, the aqueous solution of acetic acid dropped in a center of the base to be processed spreads on the base to be processed 30 to thereby cover the entire base to be processed 30. A period of discharging the aqueous solution of the acetic acid is about 1 through 2 seconds. After stopping to discharge, the base to be processed 30 is continued to rotate at 2,000 rpm for additional 1 through 2 seconds to dry the aqueous solution of acetic acid remaining on the base to be processed 30 by splashing. Thus, as illustrated in FIG. 1c, a layer having a reformed surface 3m subjected to an acid treatment by an aqueous solution of acid is formed on a surface portion of the organic anti-reflective coating 3.

Figure 1D:
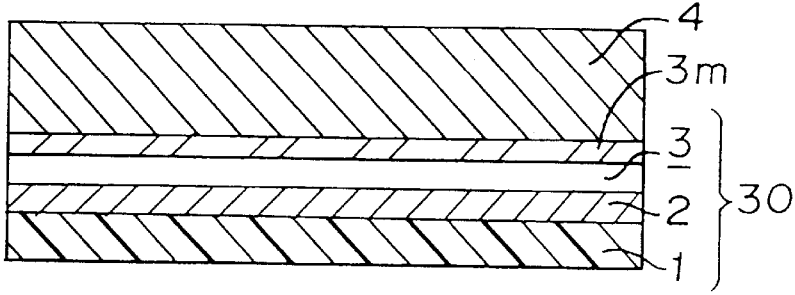
FIG. 1d is a cross sectional view for illustrating a forth step of the method of forming the resist pattern according to Embodiment 1 of the present invention.
Figure 1E:
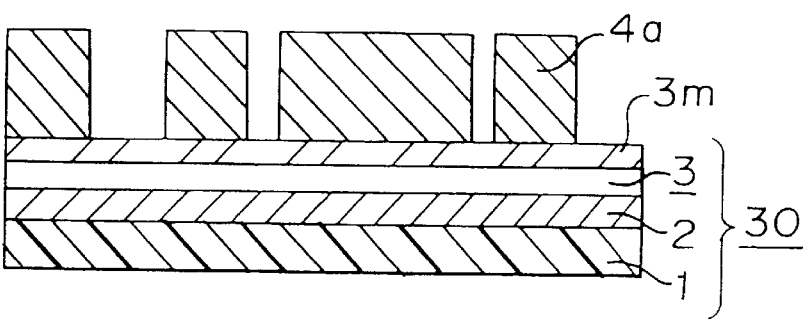
FIG. 1e is a cross sectional view for illustrating a fifth step of the method of forming the resist pattern according to Embodiment 1 of the present invention.

In the next, the resist nozzle 8 illustrated in FIG. 2 is moved to a center of the base to be processed 30 and a resist is coated in a similar manner to that of a conventional technique, whereby a resist coating 4 is formed as illustrated in FIG. 1d. The resist used herein is not particularly limited and resists of various types can be used. Thereafter, as illustrated in FIG. 1, the resist coating 4 is exposed and developed to thereby form a predetermined resist pattern 4a.

As described, according to the method of forming the resist pattern described in Embodiment 1, it is possible to increase choices of resist enabling to use and improve deterioration of an accuracy in dimensions caused by deterioration of resist shapes or the like by changing the characteristics of the surface of the organic anti-reflective coating though resists for forming patterns having good shapes were limited because of a conventional organic anti-reflective film containing compounds being relatively basic. Particularly, in case that a material of resist demonstrating a high performance on an organic coating showing acidic characteristics is used, it is possible to greatly demonstrate a performance by conducting an acidic treatment to the surface portion of the organic anti-reflective coating.

Further, by installing a nozzle, which can treat the acid treating liquid, in the cup accommodating the resist, there are advantages that another cup for coating is not necessary and a throughput capacity is improved.

Figure 3:
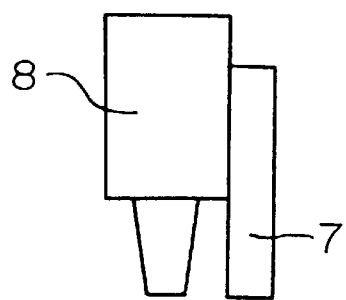
FIG. 3 schematically shows a structure of a nozzle portion of the device for forming a resist pattern according to Embodiment 1 of the present invention.

An example that the nozzle for treating acid 7 and the resist nozzle 8 are transferred to the center of the base to be processed 30 by separate systems for transferring was exemplified. However, as illustrated in FIG. 3, it is preferable to use a device for finishing a transfer of nozzle at one time by installing the acid treating nozzle 7 in the resist nozzle 8.

Embodiment 2

Although an example that the organic anti-reflective coating 3 was treated by the acid treating liquid was described, it is possible to use a basic treating liquid instead of the acid treating liquid. A developing solution and an aqueous ammonia may be used as the basic treating liquid.

When the developing solution is used for the treatment, it is possible to use a developer cup of a conventionally used resist coating and developing device, whereby complication of such a device can be avoided to facilitate a practice of the present invention. Incidentally, in case that a resist material demonstrating a high performance on the organic film having a basic base, it is possible to greatly demonstrate a performance.

Embodiment 3

Although, in Embodiment 1, the case that the organic anti-reflective coating 3 was practically subjected to a surface treatment by an acidic treating liquid was described, a similar effect is obtainable by oxidizing the surface of the organic anti-reflective coating 3.

The oxidation treatment is a plasma oxidation treatment, a photo oxidation treatment, a sulfate treatment or the like. Among these, the plasma oxidation treatment and the photo oxidation treatment are particularly effective in consideration of easiness of its controllability.

The surface oxidation treatment is conducted by the plasma oxidation treatment using a resist ashing system under conditions of:

Oxygen 500 mTorr; and

Rf power 500 W

On the other hand, the photo oxidation treatment can be conducted using a Deep Ultra Violet (DUV) curing device.

Further, by arranging an asher, a Deep Ultra Violet (DUV) curing oven, and a developing unit in line with a resist coater, it is possible to improve a throughput capacity.

Further, in a case that a pattern of the organic film substrate is transferred using the resist pattern 4a as a mask by dry-etching, a rate of dry-etching becomes high; and a thin film of the resist material can be used to improve a resist capability by such a thin film.

Embodiment 4

Although, in Embodiment 1, the treatment is conducted at a baking temperature of 160° C. for 60 seconds after coating the organic anti-reflective coating 3, it is possible-to change conditions of the surface of the organic anti-reflective coating by increasing the baking temperature.

The baking temperature is applicable by changing and optimizing depending on properties of a resist to be used. For example, in case of KrF-2 used in Embodiment 1, a chemically amplified resist of acetal system is suitable for baking at 160° C., and a resist of annealing type is suitable for baking at 200° C.

According to the invention described in Embodiment 4, it is possible to change congeniality of the organic anti-reflective coating with a resist by changing a temperature of the hot plate.

Embodiment 5

Although, in Embodiment 4, the surface conditions of the anti-reflective coating 3 are changed by changing the baking temperature after coating the anti-reflective coating 3, it becomes possible to apply the method to various resist materials using a substance, of which volatility is changed at around the baking temperature, as a component of the anti-reflective coating 3.

Such an additive is suitably a material having a boiling point of at around 80° C. through 150° C. When it is desired to make the surface acidic diazomethane sulfonic acid, the sulfonic acid, or the like is effective. An acid generator ordinarily used as chemically amplified resist materials is one of the additives demonstrating such an effect of making the surface to be acidic. Examples of the additives will be illustrated in the following Chemical Formulas 1 through 6.

[Chemical Formula 1]

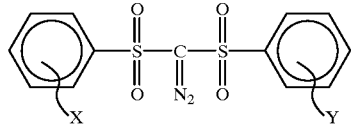

[Chemical Formula 2]

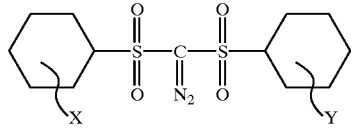

[Chemical Formula 3]

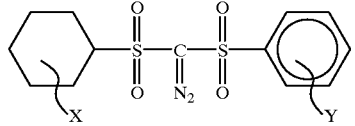

[Chemical Formula 4]

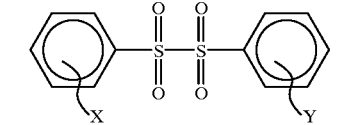

[Chemical Formula 5]

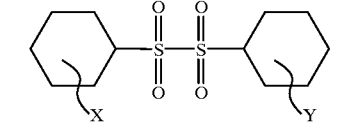

[Chemical Formula 6]

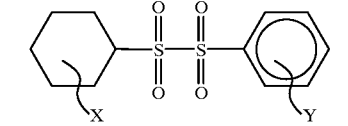

In the above Chemical Formulas 1 through 6, X and Y are hydrogen (H), a alkyl group, a hydroxyl group, or a nitro group, where X and Y may not be the same.

When such additives changing the amount of substance existing in the organic film substrate depending on the baking temperature is used, it is possible to serve the surface of the organic film substrate suitable for the resist material without specifically changing the device of complicating producing processes.

Embodiment 6

Figure 4:
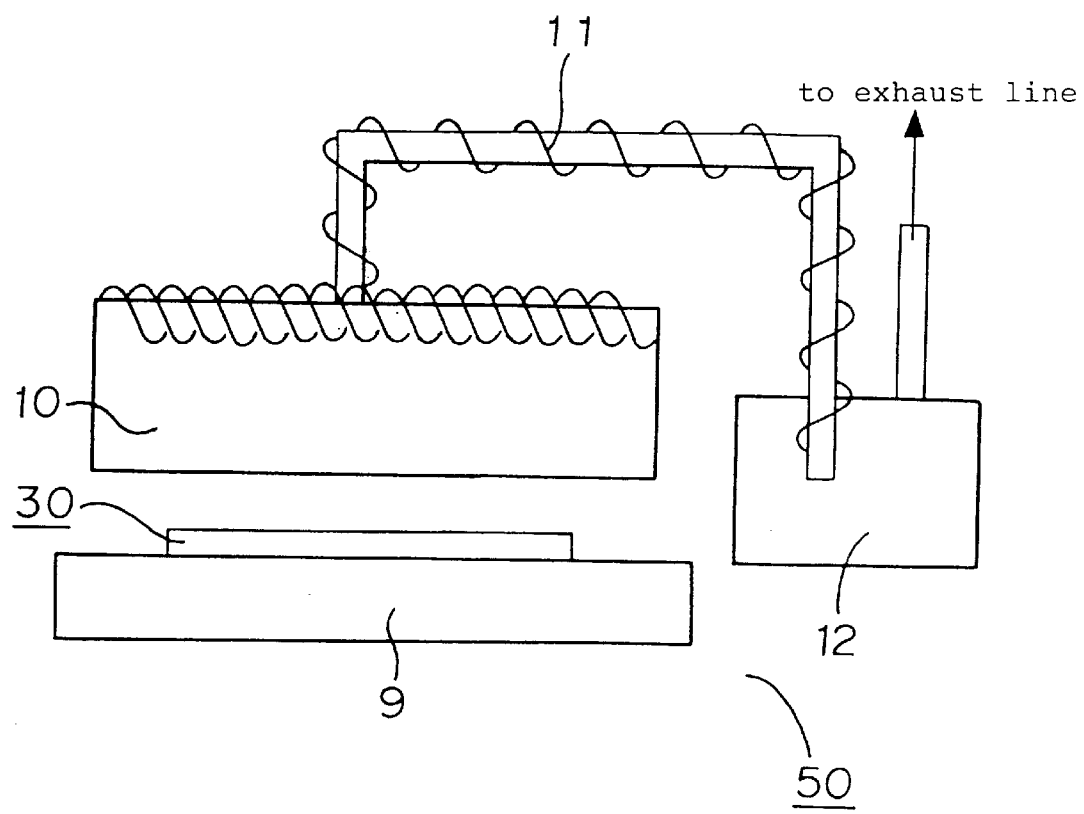
FIG. 4 schematically shows a structure of a hot plate according to Embodiment 6 of the present invention.

FIG. 4 is a diagram for showing a structure of hot plate according to Embodiment 6 of the present invention. The hot plate 50 includes a heater 9, a hot plate cover 10, a trap tank 12, and a hot wire 11, wherein the base to be processed 30 is heated on the heater 9.

Incidentally, in Embodiments 4 and 5, it is necessary to bake at a high temperature for desirably changing the properties of the surface of the anti-reflection base coating 3. At this time, diazomethane sulfonic acid or disulfonic acid, introduced in Embodiment 5, escapes from the anti-reflection base coating at the time of high temperature baking, is deposited in the vicinity of an exhaust port connected to the hot plate and also on an inside of the hot plate cover. Such deposits may contaminate other substrate wafer to be processed, whereby it is necessary to remove these.

To deal therewith, as shown in FIG. 4, the hot wire 11 is provided,in the hot plate cover used for baking to thereby scald the hot plate cover through the exhaust port, whereby it is possible to prevent the deposits from being produced. Further, by forming the trap tank 12 for trapping substances escaping from the organic coating at a time of heat treatment in an exhaust line, it is possible to prevent contaminations from entering by a side of a factory from the exhaust port.

As described, by adding parts such as the trap tank trapping substances escaping from the organic coating at the time of heat treatment of the organic coating, it is possible to solve the problems described in Embodiments 4 and 5.

The first advantage of the present invention is that an accuracy in dimensions of processed films is improved along with an increment of a resist available for processing films to be processed positioned on a semiconductor substrate because a surface of an organic coating is reformed depending on properties of resist material.

The second advantage of the present invention is that a performance of processing is largely improved when a resist material demonstrating a high performance on an acidic organic coating because a surface of organic coating is reformed using an acidic solution.

The third advantage of the present invention is that the invention can be easily practiced without complication of a device for forming a resist pattern and a performance of processing is largely improved when a resist material demonstrating a high performance on a basic organic coating because a surface of organic coating is reformed using a base solution.

The forth advantage of the present invention is that a resist material can be made to be a thin film and a performance of resist is improved because a surface of organic coating is reformed by a surface oxidation treatment to increase a rate of dry-etching of the organic coating.

The fifth advantage of the present invention is that it is possible to match an organic coating with a resist by changing only a temperature of hot plate because a surface of the organic coating is reformed by adjusting a temperature of heat treatment for the organic coating.

The sixth advantage of the present invention is that a surface of organic coating suitable for a resist material can be served without specifically changing a device for forming a resist pattern and a complication of producing steps because substances escaping from an inside of coating to an outside of coating by a heat treatment are contained by introducing or bonding in the organic coating.

The seventh advantage of the present invention is that a semiconductor device having patterns with an excellent accuracy in dimensions can be realized because a surface of organic coating is reformed depending on properties of resist material.

The eighth advantage of the present invention is that a device for forming resist patterns having an excellent throughput capacity because chemical solution supplying system provided for reforming a surface of organic coating is disposed on a cup of a resist coater to unnecessitate another cup for coating.

The ninth advantage of the present invention is that it is possible to prevent a contamination on a side of factory from an exhaust port because a part for trapping substances escaping from an organic coating at a time of heat treatment of the organic coating is disposed on a hot plate.

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a resist pattern comprising steps of
   forming a film to be etched on a semiconductor base, wherein said film is an inorganic material selected from the group consisting of an oxide, polysilicon, a silicide and a metal;
   forming an antireflective organic coating having a surface on said film to be etched;
   treating said organic coating with an acid solution to reform the surface of said coating; and
   forming a resist film on said organic coating.

2. A method of manufacturing a semiconductor device using the method of forming the resist pattern according to claim 1.

* * * * *